(12) United States Patent
Koyama

(10) Patent No.: US 12,237,811 B2
(45) Date of Patent: *Feb. 25, 2025

(54) DEVICE EMITTING OR DETECTING TERAHERTZ WAVES, AND MANUFACTURING METHOD FOR DEVICE

(71) Applicant: CANON KABUSHIKI KAISHA, Tokyo (JP)

(72) Inventor: Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

This patent is subject to a terminal disclaimer.

(21) Appl. No.: 18/115,054

(22) Filed: Feb. 28, 2023

(65) Prior Publication Data

US 2023/0208359 A1 Jun. 29, 2023

Related U.S. Application Data

(63) Continuation of application No. 17/027,875, filed on Sep. 22, 2020, now Pat. No. 11,626,839.

(30) Foreign Application Priority Data

Sep. 24, 2019 (JP) .................................. 2019-173084

(51) Int. Cl.
*H03B 7/08* (2006.01)
*H01Q 1/22* (2006.01)
(Continued)

(52) U.S. Cl.
CPC ............. *H03B 7/08* (2013.01); *H01Q 1/2283* (2013.01); *H01Q 9/0457* (2013.01); *H01Q 9/24* (2013.01); *H01Q 23/00* (2013.01)

(58) Field of Classification Search
None
See application file for complete search history.

(56) References Cited

U.S. PATENT DOCUMENTS 9,154,084 B2   10/2015   Harwalkar et al.
9,184,697 B2   11/2015   Sekiguchi et al.
(Continued)

FOREIGN PATENT DOCUMENTS

CN    102668370 A    9/2012
CN    103811860 A    5/2014
(Continued)

OTHER PUBLICATIONS

Jenshan Lin et al., "Two-Dimensional Quasi-Optical Power-Combining Arrays Using Strongly Coupled Oscillators", IEEE Transactions on Microwave Theory and Techniques, vol. 42, No. 4, pp. 734-741, Apr. 1994.

(Continued)

*Primary Examiner* — Wilson Lee
(74) *Attorney, Agent, or Firm* — Venable LLP

(57) ABSTRACT

A device includes a first antenna arranged on a substrate, with the first antenna comprising a first semiconductor layer having terahertz-wave gain and a first conductor layer, a second antenna arranged on the substrate, with the second antenna comprising a second semiconductor layer having terahertz-wave gain and a second conductor layer, and a third conductor layer arranged on the substrate and electrically connecting the first antenna and the second antenna. A shunt device is arranged on the substrate and electrically connected to the third conductor layer. In planar view, the shunt device does not overlap with at least the first conductor layer.

17 Claims, 9 Drawing Sheets

(51) Int. Cl.
*H01Q 9/04* (2006.01)
*H01Q 9/24* (2006.01)
*H01Q 23/00* (2006.01)

(56) References Cited

U.S. PATENT DOCUMENTS

| | | |
|---|---|---|
| 9,865,920 B1 | 1/2018 | Kuo et al. |
| 9,998,074 B2 | 6/2018 | Koyama |
| 10,090,585 B2 | 10/2018 | Dinc et al. |
| 10,985,466 B2 | 4/2021 | Ma et al. |
| 11,626,839 B2 * | 4/2023 | Koyama ................ H03B 9/147 343/720 |
| 2010/0026400 A1 | 2/2010 | Koyama et al. |
| 2010/0045392 A1 | 2/2010 | Koyama et al. |
| 2012/0119838 A1 | 5/2012 | Koyama et al. |
| 2012/0274410 A1 | 11/2012 | Koyama |
| 2014/0132466 A1 | 5/2014 | Inoue et al. |
| 2014/0197896 A1 * | 7/2014 | Ouchi ..................... H03C 7/025 331/107 T |
| 2014/0266477 A1 | 9/2014 | Sekiguchi et al. |
| 2015/0346034 A1 * | 12/2015 | Lee ....................... H01Q 1/2283 250/504 R |
| 2016/0006215 A1 | 1/2016 | Koyama et al. |
| 2016/0344343 A1 | 11/2016 | Feiginov et al. |
| 2016/0373061 A1 | 12/2016 | Sekiguchi |
| 2017/0271774 A1 * | 9/2017 | Mukai ...................... G02F 1/39 |
| 2018/0152141 A1 * | 5/2018 | Koyama ........... H01L 31/02327 |
| 2019/0067788 A1 * | 2/2019 | Koyama .............. H01Q 9/0421 |
| 2020/0293806 A1 | 9/2020 | Sato et al. |
| 2020/0296265 A1 | 9/2020 | Itsuji et al. |
| 2020/0296266 A1 | 9/2020 | Koyama et al. |
| 2021/0066811 A1 | 3/2021 | Tsuruda |

FOREIGN PATENT DOCUMENTS

| | | |
|---|---|---|
| CN | 105190991 A | 12/2015 |
| JP | 2005-123385 A | 5/2005 |
| JP | 2008-010811 A | 1/2008 |
| JP | 2014-200065 A | 10/2014 |
| JP | 2017-201779 A | 11/2017 |
| WO | 2016/203712 A1 | 12/2016 |

OTHER PUBLICATIONS

Hidetoshi Kanaya et al., "Fundamental Oscillation up to 1.42 THz in Resonant Tunneling Diodes by Optimized Collector Spacer Thickness", J. Infrared Milli. Terahz Waves, vol. 35, pp. 425-431, Feb. 16, 2014.

Masahiro Asada et al., "Theoretical analysis of coupled oscillator array using resonant tunneling diodes in subterahertz and terahertz range", J. Appl. Phys., vol. 103, pp. 124514, Jun. 27, 2008.

Masahiro Asada et al., "Resonant Tunneling Diodes for Sub-Terahertz and Terahertz Oscillators", Jpn. J. Appl. Phys., vol. 47, No. 6, pp. 4375-4384, Jun. 13, 2008.

M. Reddy et al., Monolithic Schottky-Collector Resonant Tunnel Diode Oscillator Arrays to 650 Ghz:, IEEE Electron Device Letters, vol. 18, No. 5, pp. 218-221 (May 31, 1997).

M. Minegishi et al., "Mode Switching in an Active Antenna Using Reactive FET", European Microwave Conference Proceedings, Vo. 2, pp. 1127-1130 (May 9, 1994).

Feb. 16, 2021 Extended European Search Report in European Patent Application No. 20 19 7671.9.

Nov. 29, 2023 Office Action in Chinese Patent Application Pub. No. 202010996019.1.

Jul. 9, 2024 Office Action in Japanese Patent Application Pub. No. 2023-117649 (with English translation).

* cited by examiner

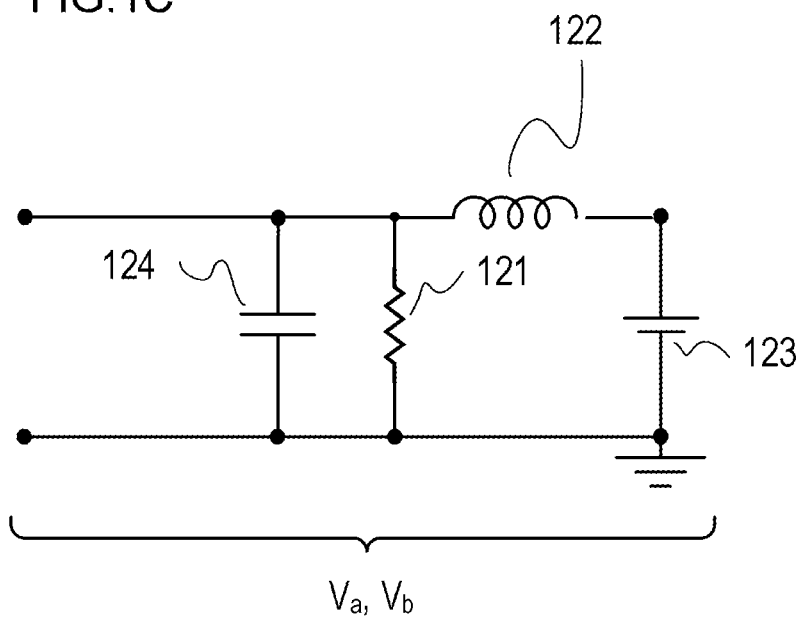

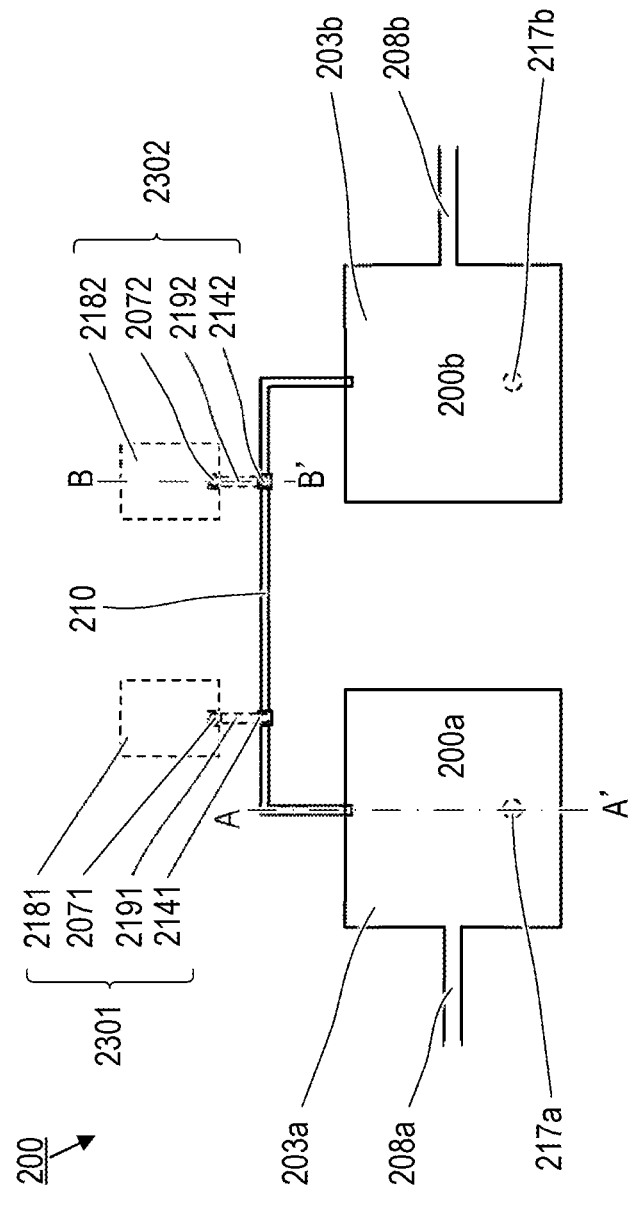

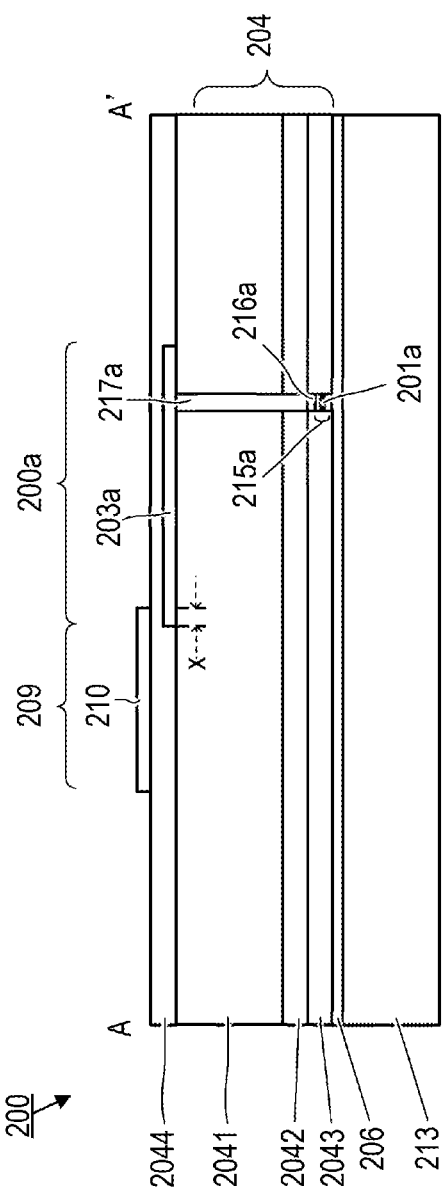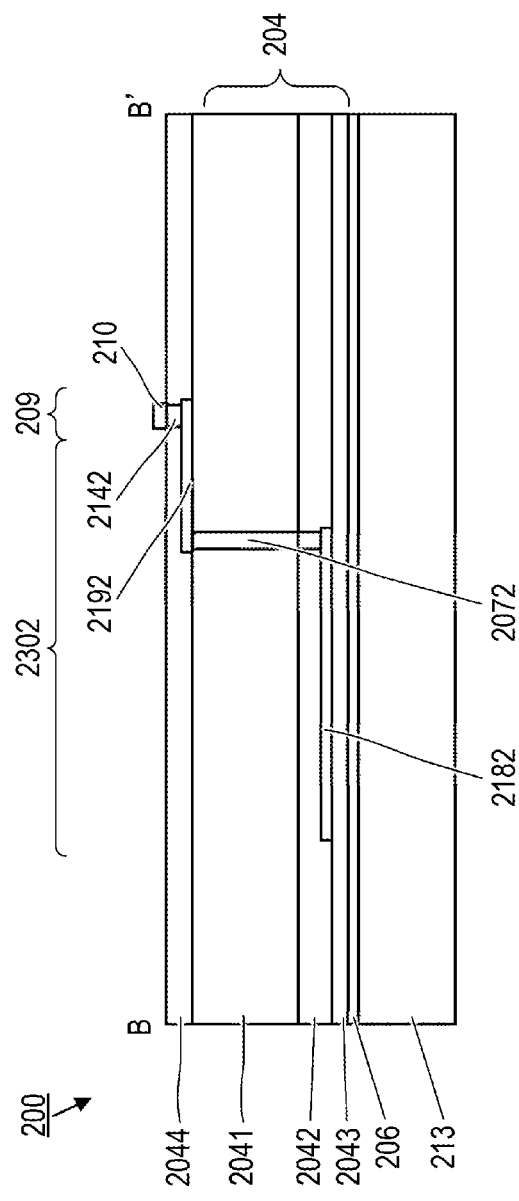

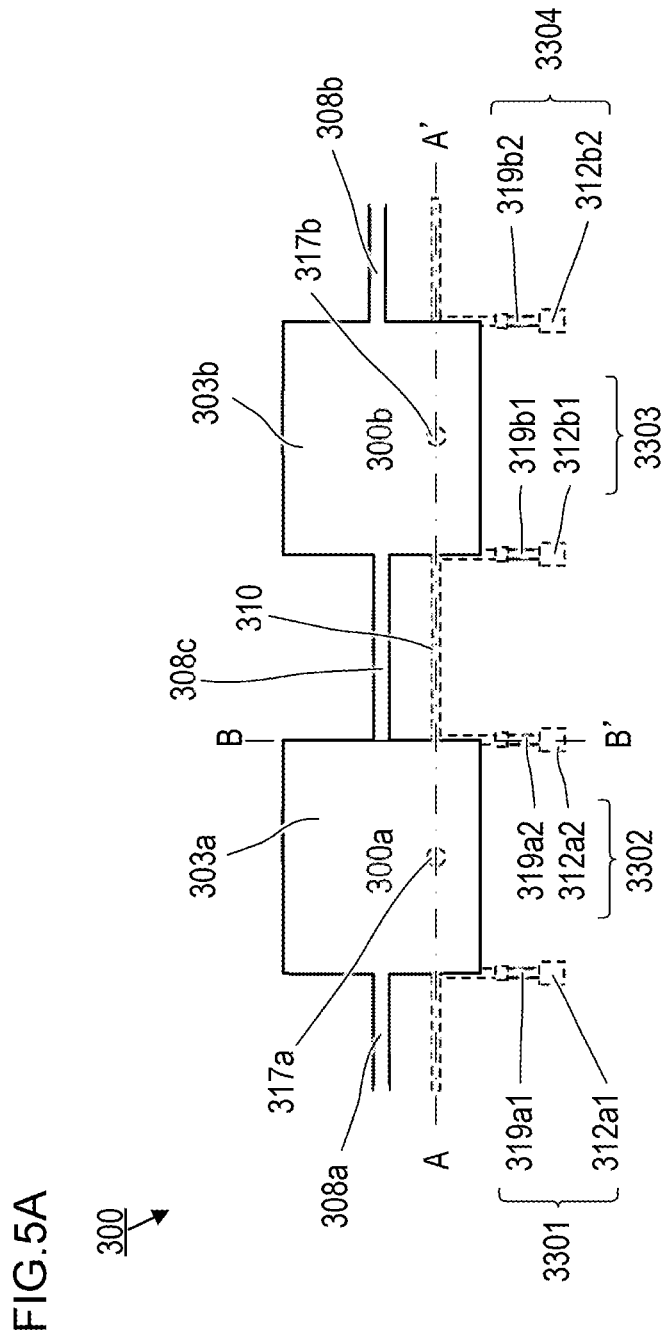

DEVICE EMITTING OR DETECTING TERAHERTZ WAVES, AND MANUFACTURING METHOD FOR DEVICE

BACKGROUND OF THE INVENTION

Field of the Invention

The present invention relates to a device that emits or detects terahertz waves, and to a manufacturing method for the device.

Description of the Related Art

There is known an oscillator, in which a resonator and a semiconductor device having terahertz electromagnetic-wave gain are integrated, as a current-injection type light source that generates terahertz waves, which are electromagnetic waves in a frequency region of at least 30 GHz and not more than 30 THz. Particularly, there is expectancy for an oscillator, in which a resonant tunneling diode (RTD) and an antenna are integrated, as a device that operates at a frequency region near 1 THz at room temperature.

"Jpn. J. Appl. Phys., Vol. 47, No. 6 (2008), pp. 4375-4384" describes a terahertz-wave oscillator in which an RTD and a slot-antenna resonator are integrated on a semiconductor substrate. In this description, a double-barrier RTD made up of an InGaAs quantum-well layer and AlAs tunnel-barrier layer epitaxially grown on an InP substrate is used. An oscillator using such an RTD can realize terahertz-wave oscillation in a region, where voltage-current (V-I) characteristics yield negative differential resistance, at room temperature.

Further, Japanese Patent Application Publication No. 2014-200065 describes a terahertz-wave antenna array in which a plurality of oscillators, in which RTDs and antennas are integrated, are arranged on the same substrate. The antenna array described in Japanese Patent Application Publication No. 2014-200065 is capable of increasing antenna gain and power, by adjacent antennas synchronizing with each other.

"IEEE TRANSACTIONS ON MICROWAVE THEORY AND TECHNIQUES, VOL. 42, NO. 4, APRIL 1994" describes a configuration where adjacent antennas are connected by a chip resistor to achieve mode stabilization.

However, increasing the number of antennas (the number of negative-resistance devices) in the antenna array increases the number of modes to be synchronized (number of resonance frequency bands), hence, the greater the number of antennas is, the more difficult stabilization of generation or detection of terahertz waves by the device becomes.

Accordingly, there have been cases in devices having a plurality of antennas where efficient generation or detection of terahertz waves is not realized due to there being a plurality of modes for synchronization.

SUMMARY OF THE INVENTION

Accordingly, the present technology realizes more efficient generation or detection of terahertz waves in a device provided with a plurality of antennas.

A first aspect of the disclosure of the present technology is:
a device, comprising:
an antenna array provided with a plurality of antennas each having a semiconductor layer having terahertz-wave gain; and
a coupling line for mutual frequency-locking of at least two of the antennas at a frequency of the terahertz-wave, wherein
the coupling line is connected to a shunt device, and
the shunt device is connected in parallel to the semiconductor layer of each of the two antennas.

A second aspect of the disclosure of the present technology is:
a manufacturing method for a device provided with an antenna array having a plurality of antennas, the method comprising:
forming, on a substrate, a semiconductor layer having terahertz-wave gain;
forming, on the substrate, a first conductor layer,
forming a shunt device connected in parallel to a semiconductor layer of each of two antennas, and connected to a coupling line for mutual frequency-locking of the plurality of antennas at the terahertz-wave frequency; and
forming a third conductor layer to form the coupling line that has a structure where a first dielectric layer is sandwiched between the first conductor layer and the third conductor layer.

Further features of the present invention will become apparent from the following description of exemplary embodiments with reference to the attached drawings.

BRIEF DESCRIPTION OF THE DRAWINGS

FIGS. 1A through 1C are diagrams illustrating equivalent circuits of a semiconductor device according to a first embodiment;

FIGS. 4A through 4C are diagrams illustrating a configuration of a semiconductor device according to a first modification; and FIGS. 5A through 5C are diagrams illustrating a configuration of a semiconductor device according to a second modification.

DESCRIPTION OF THE EMBODIMENTS

First Embodiment

A semiconductor device 100 according to a first embodiment will be described below. The semiconductor device 100 generates (emits) or detects terahertz waves (electromagnetic waves in a frequency region of at least 30 GHz and not more than 30 THz) of a frequency (resonance frequency, oscillation frequency) $f_{THz}$. Note that an example where the semiconductor device 100 is used as an oscillator will be described below. The length of each configuration in the stacking direction of the semiconductor device 100 will be referred to as "thickness" or "height".

Description Regarding Circuit Configuration of Semiconductor Device

Figure 1A:
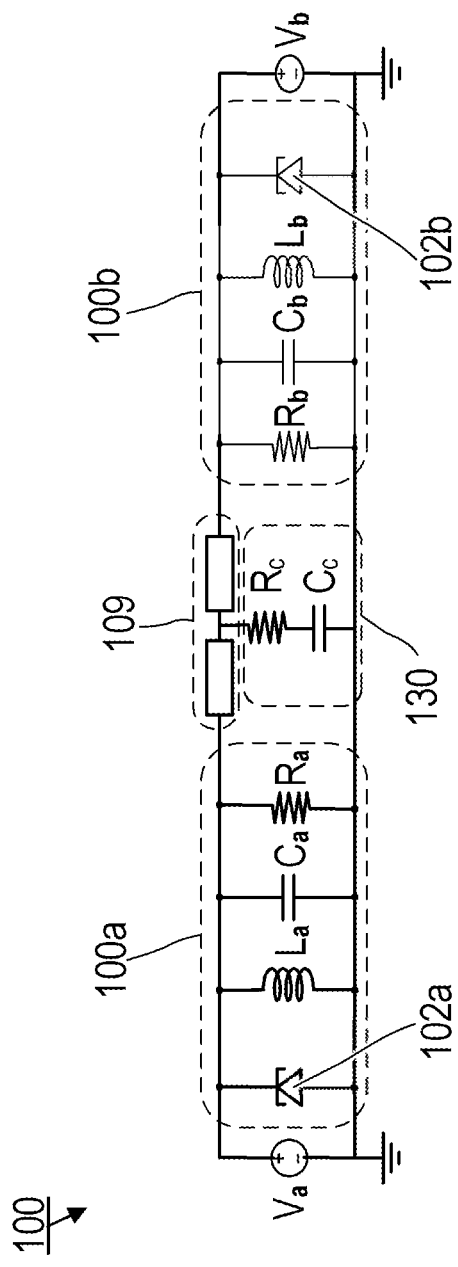

First, a circuit configuration of the semiconductor device 100 will be described. FIG. 1A is a diagram describing an equivalent circuit of the semiconductor device 100. FIG. 1C is a diagram describing an equivalent circuit of bias circuits $V_a$ and $V_b$ that the semiconductor device 100 has.

The semiconductor device 100 has an antenna array where a plurality of antennas are provided. The semiconductor device 100 has an antenna array where an antenna 100a and an antenna 100b are provided adjacently in the present embodiment. The antenna 100a serves both as a resonator that resonates with terahertz waves, and as a radiator that transmits or receives terahertz waves. The antenna 100a internally has a semiconductor layer 115a for generating or detecting terahertz waves (electromagnetic waves). The antenna 100b has the same configuration as the antenna 100a. The configuration of the antenna 100a will be described in detail below, and detailed description of components of the antenna 100b that are the same as those of the antenna 100a will be omitted.

Description will be made regarding the semiconductor device 100 provided with two antennas in the present embodiment, but the number of antennas may be three or more. For example, the semiconductor device 100 may have an array where the antennas are arrayed in a 3×3 matrix array. Alternately, the semiconductor device 100 may have a linear array where three antennas are linearly arrayed in the column or row direction. The semiconductor device 100 may have a configuration of an antenna array where m×n (m≥2, n≥2) antennas are arrayed in a matrix. These antennas also preferably are laid out at a pitch that is an integer multiple of the wavelength of terahertz waves of a frequency $f_{THz}$.

Note that in the following description, alphabet characters indicating the corresponding antenna are appended to the end of the symbols denoting the components belonging to the antenna 100a and the antenna 100b. More specifically, "a" is appended to the end of symbols denoting components that the antenna 100a has, and "b" is appended to the end of symbols denoting components that the antenna 100b has.

As illustrated in FIG. 1A, a semiconductor 102a, a resistor $R_a$ determined by antenna radiation and conductor loss, and LC component (capacitor $C_a$ and inductance $L_a$) determined by structure, are connected in parallel in the antenna 100a. Also, a bias circuit $V_a$ for supplying bias signals to the semiconductor 102a is connected in parallel to the semiconductor 102a.

The semiconductor 102a has electromagnetic-wave gain or carrier nonlinearity (nonlinearity in current in accordance with voltage change in current-voltage characteristics) with regard to terahertz waves. A resonant tunneling diode (RTD), which is a typical semiconductor having electromagnetic-wave gain at the terahertz wave frequency band, is used as the semiconductor 102a in the present embodiment. The semiconductor 102a includes a circuit where the negative differential resistance of the RTD and the diode capacitor are connected in parallel (omitted from illustration).

The antenna 100b is configured of a circuit where a semiconductor 102b, a resistor $R_b$, LC component ($C_b$ and $L_b$), and bias circuit $V_b$ are connected in parallel, in the same way as with the antenna 100a. The antennas singularly transmit or receive terahertz waves of a frequency $f_{THz}$.

The bias circuits $V_a$ and $V_b$ have a power source and stabilization circuit for supplying bias signals to the semiconductor 102a of the antenna 100a and the semiconductor 102b of the antenna 100b. The bias circuits $V_a$ and $V_b$ each have a shunt resistor 121, wiring 122, a power source 123, and a capacitor 124, as illustrated in FIG. 1C.

The shunt resistor 121 is connected in parallel with the semiconductors 102a and 102b. The capacitor 124 is connected in parallel with the shunt resistor 121. The power source 123 supplies current necessary to drive the semiconductors 102a and 102b, and adjusts bias signals applied to the semiconductors 102a and 102b. In a case of using RTDs for the semiconductors 102a and 102b, the bias signals are selected from voltage in the negative differential resistance region of the RTDs. The shunt resistor 121 and capacitor 124 of the bias circuits $V_a$ and $V_b$ suppress parasitic oscillation of relatively low-frequency resonance frequency (typically a frequency band from DC to 10 GHz) due to the bias circuits $V_a$ and $V_b$.

The adjacent antenna 100a and antenna 100b are mutually joined by a coupling line 109. The coupling line 109 is connected to a shunt device 130 connected in parallel to each of the semiconductors 102a and 102b. Thus, frequencies other than the operating frequency $f_{THz}$ of the terahertz waves desired are short-circuited due to the shunt device 130 being provided, and the semiconductor device 100 is low impedance at this frequency. This suppresses resonance at a plurality of frequency bands (multimode resonance) from occurring. Note that from the perspective of antenna radiation efficiency, the shunt device 130 preferably is positioned (connected) to the node of the electric field of terahertz waves of the standing resonance frequency $f_{THz}$ at the coupling line 109. The "position that is the node of the electric field of terahertz waves of the standing resonance frequency $f_{THz}$ at the coupling line 109" here is, for example, a position where the intensity of the electric field of terahertz waves of the standing resonance frequency $f_{THz}$ at the coupling line 109 drops by around one digit or so.

A resistor $R_c$ and a capacitor $C_c$ are serially connected at the shunt device 130, as illustrated in FIG. 1A. A value that is equal to or somewhat lower than the absolute value of the combined negative differential resistance of the semiconductors 102a and 102b connected in parallel is selected here for the resistor $R_c$. Also, the capacitor $C_c$ is set so that the impedance is equal to or somewhat lower than the absolute value of the combined negative differential resistance of the semiconductors 102a and 102b connected in parallel. That is to say, the values of the resistor $R_c$ and the capacitor $C_c$ are each preferably set so that the impedance is lower than the absolute value of the negative resistance (impedance) corresponding to the gain of the semiconductor 102a and the semiconductor 102b. Considering that the typical value of negative resistance of RTDs used in terahertz bands is 0.1 to 1000Ω, the value of the resistor $R_c$ is set in the range of 0.1 to 1000Ω. Also, the value of the capacitor $C_c$ is typically set in the range of 0.1 to 1000 pF, in order to obtain a shunt effect at the frequency range of 10 GHz to 1000 GHz. Note that it is sufficient for the impedance conditions of the resistor $R_c$ and the capacitor $C_c$ with regard to the negative resistance of the RTD to be satisfied at a frequency band lower than the resonance frequency $f_{THz}$.

Description Regarding Structure of Semiconductor Device

Figure 2A:
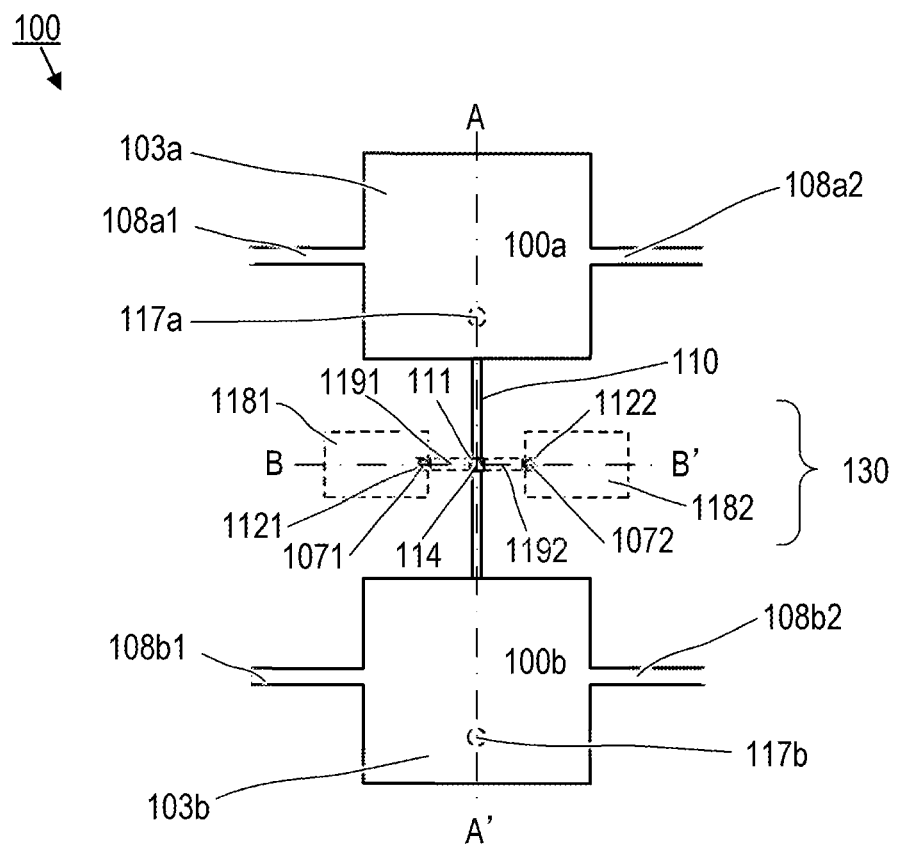
FIGS. 2A through 2C are diagrams illustrating a configuration of the semiconductor device according to the first embodiment.
Figure 2B:
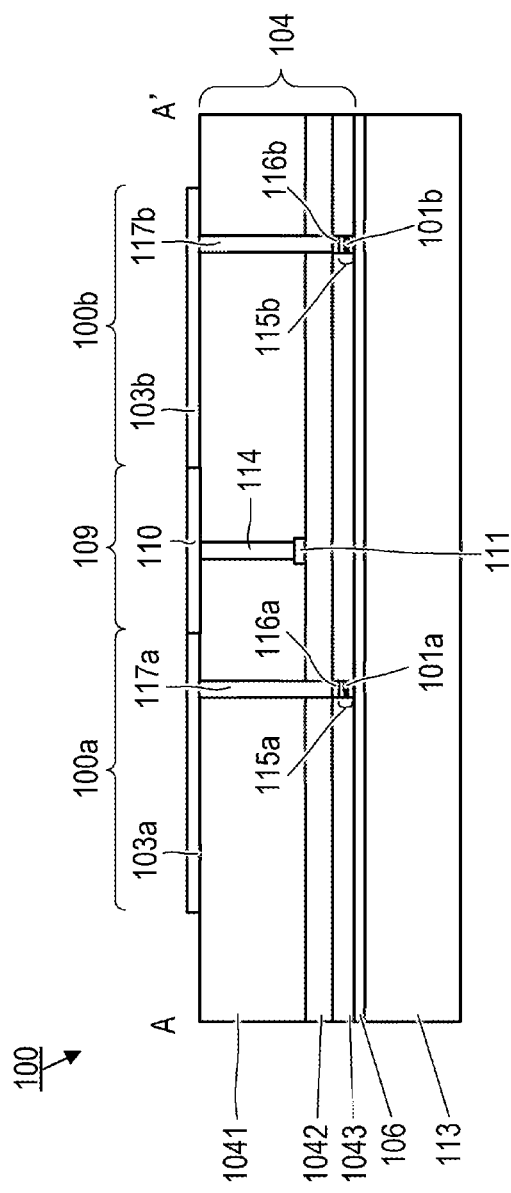
Figure 2C:
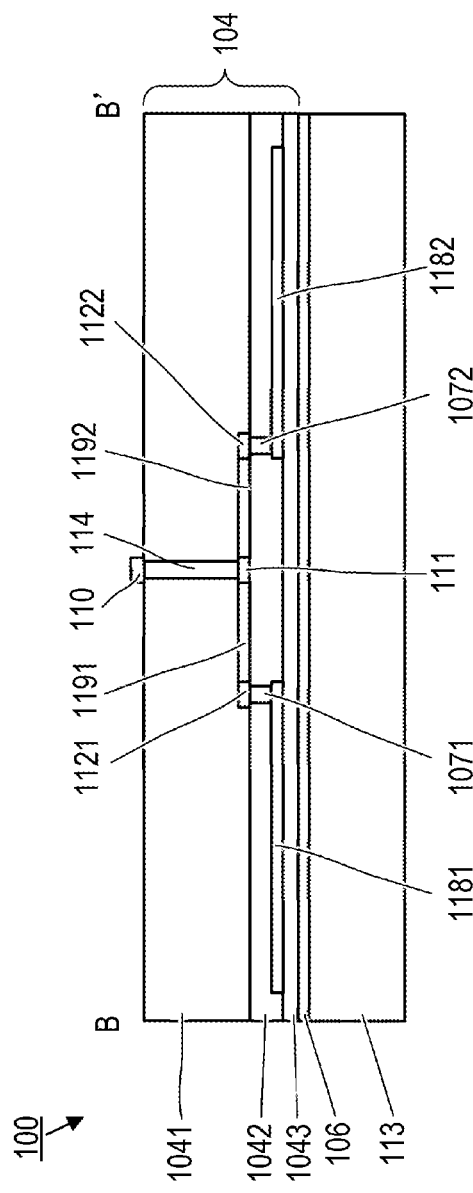

Next, a specific structure of the semiconductor device 100 will be described. FIG. 2A is a top view of the semiconductor device 100. FIG. 2B is a cross-sectional view of the semiconductor device 100 in FIG. 2A, taken along A-A', and FIG. 2C is a cross-sectional view of the semiconductor device 100 in FIG. 2A, taken along B-B'.

The antenna 100a includes a substrate 113, a first conductor layer 106, a semiconductor layer 115a, an electrode 116a, a conductor 117a, a dielectric layer 104, and a second conductor layer 103a. The antenna 100a has a configuration where the two conductors, i.e., the first conductor layer 106 and the second conductor layer 103a, sandwich the dielectric layer 104 that is made up of the three layers of a first dielectric layer 1041, a second dielectric layer 1042, and a third dielectric layer 1043, as illustrated in FIG. 2B. Such a configuration is known as a microstrip antenna. An example will be described in the present embodiment where the antennas 100a and 100b are used as patch antennas, which are representative microstrip resonators.

The second conductor layer 103a is a patch conductor of the antenna 100a, and is disposed facing the first conductor layer 106 across the dielectric layer 104 (semiconductor layer 115a). The second conductor layer 103a is electrically connected to the semiconductor layer 115a. The antenna 100a is designed as a resonator where the width of the second conductor layer 103a is $\lambda_{THz}/2$ in the A-A' direction (resonance direction). Also, the first conductor layer 106 is a ground conductor, and is electrically grounded. Note that $\lambda_{THz}$ is the effective wavelength of the dielectric layer 104 of terahertz waves resonating at the antenna 100a, and is expressed as $\lambda_{THz}=\lambda_0 \times \varepsilon_r^{-1/2}$, where $\lambda_0$ represents the wavelength of the terahertz waves in a vacuum, and $\varepsilon_r$ represents the effective relative dielectric constant of the dielectric layer 104.

The semiconductor layer 115a corresponds to the semiconductor layer 102a in the equivalent circuit illustrated in FIG. 1A, and includes an active layer 101a configured of a semiconductor that has electromagnetic-wave gain or carrier nonlinearity with respect to terahertz waves. An example of using an RTD as the active layer 101a will be described in the present embodiment. In the following, the active layer 101a will be described as RTD 101a.

The semiconductor layer 115a is formed disposed on the first conductor layer 106 that is formed on the substrate 113, with the semiconductor layer 115a and the first conductor layer 106 being electrically connected. Note that a low-resistance connection between the semiconductor layer 115a and the first conductor layer 106 is preferable, to reduce Ohmic loss.

The RTD 101a has a resonant tunneling structure layer that includes a plurality of tunnel-barrier layers. Quantum-well layers are provided between the plurality of tunnel-barrier layers in the RTD 101a, thereby being provided with a multiple quantum-well structure that generates terahertz waves by carrier intersubband transition. The RTD 101a has electromagnetic-wave gain in the frequency region of terahertz waves based on the photo-assisted tunneling phenomenon, in the negative differential resistance region of current-voltage characteristics, and exhibits self-excitation oscillation in the negative differential resistance region. The RTD 101a is disposed at a position shifted by 40% in the resonance direction (i.e., A-A' direction) from the center of gravity of the second conductor layer 103a.

The antenna 100a is an active antenna where the semiconductor layer 115a including the RTD 101a and a patch antenna have been integrated. The frequency $f_{THz}$ of terahertz waves emitted from the singular antenna 100a is determined as a resonance frequency of the entire parallel resonance circuit where the patch antenna and the semiconductor layer 115a reactance are combined. Specifically, with regard to an equivalent circuit of the oscillator described in "Jpn. J. Appl. Phys., Vol. 47, No. 6 (2008), pp. 4375-4384", a frequency that satisfies the amplitude condition of Expression (1) and the phase condition of Expression (2) is determined as the resonance frequency $f_{THz}$ of a resonance circuit where the admittance of the RTD and antenna ($Y_{RTD}$ and $Y_{aa}$) are combined.

$$\text{Re}[Y_{RTD}]+\text{Re}[Y_{aa}]\leq 0 \tag{1}$$

$$\text{Im}[Y_{RTD}]+\text{Im}[Y_{aa}]=0 \tag{2}$$

Here, $Y_{RTD}$ represents the admittance of the semiconductor layer 115a, Re represents the real part, and Im represents the imaginary part. The semiconductor layer 115a includes the RTD 101a that is a negative resistance element as the active layer, so $\text{Re}[Y_{RTD}]$ has a negative value. Also, $Y_{aa}$ represents the entire admittance of the antenna 100a as viewed from the semiconductor layer 115a. Accordingly, the components $R_a$, $C_a$, and $L_a$ of the antenna in the equivalent circuit in FIG. 1A are primary circuit elements for $Y_{aa}$, and the negative differential resistance and the diode capacitor of the semiconductor 102a are primary circuit elements for $Y_{RTD}$.

Note that a quantum cascade laser (QCL) structure that has a semiconductor multilayer structure with several hundred to several thousand of layers may be used as another example of the active layer 101a. In this case, the semiconductor layer 115a is a semiconductor layer including a QCL structure. Also, a negative resistance element such as a Gunn diode or an IMPATT diode often used in milliwave bands may be used as the active layer 101a. Also, high-frequency devices such as a transistor with one end terminated may be used as the active layer 101a, suitable examples of which include heterojunction bipolar transistors (HBT), compound semiconductor field-effect transistors (FET), high-electron-mobility transistors (HEMT), and so forth. Also, negative differential resistance of Josephson devices that use superconductors may be used as the active layer 101a.

The dielectric layer 104 is formed between the first conductor layer 106 and the second conductor layer 103a. It is demanded of the dielectric layer 104 to be capable of being formed as a thick film (typically, a thick film of at least 3 μm), to exhibit low loss and low dielectric constant at the terahertz band, and to have good microfabrication characteristics (workability by planarization and etching). In microstrip resonators such as patch antennas, conductor loss is reduced and radiation efficiency can be improved by forming the dielectric layer 104 thicker. Now, the thicker the dielectric layer 104 is, the better the radiation efficiency of the resonator is, but multimode resonance occurs if excessively thick. Accordingly, the thickness of the dielectric layer 104 preferably is in a range of not more than 1/10 of the oscillation wavelength.

Meanwhile, miniaturization and high current density of diodes is required to realize high frequencies and high output of oscillators. Accordingly, measures such as suppressing leak current and migration is demanded of the dielectric layer 104, with regard to the insulation structure of the diode. In the present invention, for this reason, the dielectric layer 104 includes two dielectric layers of different types of materials (first dielectric layer 1041 and second dielectric layer 1042).

For the first dielectric layer 1041, organic dielectric materials such as benzocyclobutene (BCB, manufactured by The Dow Chemical Company, $\varepsilon_{r1}=2$), polytetrafluoroethylene, polyimide, and so forth, can be suitably used. Note that $\varepsilon_{r1}$ is the relative dielectric constant of the first dielectric layer 1041. Also, inorganic dielectric materials such as tetraethyl orthosilicate (TEOS) oxide films, spin-on glass, or the like, which are suitable for relatively thick film formation and have a low dielectric constant, may be used for the first dielectric layer 1041.

It is demanded of the second dielectric layer 1042 to exhibit insulating properties (nature of behaving as an insulator or a high-value resistor that does not allow electricity to pass under DC voltage), barrier properties (nature of preventing diffusion of metal materials used for electrodes), and workability (nature allowing precise working in submicron order). Inorganic insulator materials, such as silicon oxide ($\varepsilon_{r2}$=4), silicon nitride ($\varepsilon_{r2}$=7), aluminum oxide, aluminum nitride, and so forth, can be suitably used as the second dielectric layer 1042 to satisfy these properties. Note that $\varepsilon_{r2}$ is the relative dielectric constant of the second dielectric layer 1042.

The third dielectric layer 1043 will be described later. Note that in a case where the dielectric layer 104 is a three-layer structure as in the present embodiment, the relative dielectric constant $\varepsilon_r$ of the dielectric layer 104 is an effective relative dielectric constant determined from the thickness and relative dielectric constant of each of the first dielectric layer 1041 through third dielectric layer 1043. Also, the dielectric layer 104 does not have to be a three-layer structure in the semiconductor device 100, and may be a structure of one layer only.

Also, from the perspective of impedance matching of antenna and air (space), the difference in the dielectric constant between the antenna and air preferably is maximally small. Accordingly, a different material from the second dielectric layer 1042 is preferably used for the first dielectric layer 1041, preferably a material that has a lower relative dielectric constant than the second dielectric layer 1042 ($\varepsilon_{r1} < \varepsilon_{r2}$).

The electrode 116a is disposed on the opposite side of the semiconductor layer 115a from the side where the first conductor layer 106 is disposed. The electrode 116a and the semiconductor layer 115a are electrically connected. The semiconductor layer 115a and the electrode 116a are embedded in the second dielectric layer 1042 (second dielectric layer 1042 and third dielectric layer 1043). More specifically, the perimeters of the semiconductor layer 115a and the electrode 116a are covered by the second dielectric layer 1042 (second dielectric layer 1042 and third dielectric layer 1043).

The electrode 116a is suitable for reduction in Ohmic loss and RC delay due to serial resistance, as long as the electrode 116a is a conductor layer in Ohmic connection with the semiconductor layer 115a. In a case where the electrode 116a is used as an Ohmic electrode, examples of materials suitably used for the electrode 116a include Ti/Pd/Au, Ti/Pt/Au, AuGe/Ni/Au, TiW, Mo, ErAs, and so forth.

Also, if the region of the semiconductor layer 115a in contact with the electrode 116a is a semiconductor doped with an impurity at a high concentration, contact resistance can be further reduced, which is suitable for realizing high output and high frequencies. The absolute value of the negative resistance indicating the magnitude of gain of the RTD 101a used in the terahertz waveband is generally in the order of 1 to 100Ω, so the loss of electromagnetic waves is preferably kept to not more than 1% thereof. Accordingly, the contact resistance at the Ohmic electrode preferably is suppressed to not more than 1Ω, as a general guide.

Also, in order to operate in the terahertz band, the width of the semiconductor layer 115a ($\approx$electrode 116a) is around 0.1 to 5 μm as a typical value. Accordingly, the resistivity is kept to not more than 10 Ω·μm², suppressing the contact resistance to a range of 0.001 to several Ω. As another form, a metal that exhibits Schottky contact rather than Ohmic contact may be used for the electrode 116a. In this case, the contact interface between the electrode 116a and the semiconductor layer 115a exhibits rectifying properties, making for a suitable configuration for the antenna 100a as a terahertz wave detector. Note that a configuration where an Ohmic electrode is used as the electrode 116a will be described in the present embodiment.

In the stacking direction of the RTD 101a, the first conductor layer 106, the semiconductor layer 115a, the electrode 116a, the conductor 117a, and the second conductor layer 103a are stacked in that order from the substrate 113 side, as illustrated in FIG. 2B.

The conductor 117a is formed inside the dielectric layer 104, and the second conductor layer 103a and the electrode 116a are electrically connected via the conductor 117a. Now, if the width of the conductor 117a is excessively great, radiation efficiency deteriorates due to deterioration in resonance characteristics of the antenna 100a and increase parasitic capacitance. Accordingly, the width of the conductor 117a preferably is a dimension of a level where there is no interference with the resonance electric field, and typically, not more than λ/10 is suitable. Also, the width of the conductor 117a can be reduced to a level where serial resistance is not increased, and can be reduced to around twice the skin depth as a general guide. Accordingly, taking into consideration reduction of the serial resistance to a level around not more than 1Ω, the width of the conductor 117a typically is in a range of at least 0.1 μm and not more than 20 μm, as a general guide.

A structure that electrically connects between upper and lower layers, such as the conductor 117a, is referred to as a via. The first conductor layer 106 and the second conductor layer 103a serve as, in addition to roles as members making up a patch antenna, electrodes for injecting current to the RTD 101a by being connected to the via. A material having resistivity not greater than $1 \times 10^{-6}$ Ω·m is preferable for the material of the conductor 117a. Specifically, metals and metal-containing compounds such as Ag, Au, Cu, W, Ni, Cr, Ti, Al, AuIn alloy, TiN, and so forth are suitably used as materials for the conductor 117a.

The second conductor layer 103a is connected to lines 108a1 and 108a2. The lines 108a1 and 108a2 are leads connected to bias lines including the bias circuit $V_a$. The width of the lines 108a1 and 108a2 is set to be narrower than the width of the second conductor layer 103a. Note that width here is the width in the resonance direction of electromagnetic waves in the antenna 100a (i.e., the A-A' direction). For example, the width of the lines 108a1 and 108a2 suitably is not more than 1/10 of the effective wavelength λ of terahertz waves of the standing resonance frequency $f_{THz}$ in the antenna 100a (not more than λ/10). The reason for this is that the lines 108a1 and 108a2 are preferably disposed with dimensions and positions such that do not interfere with the resonance electric field in the antenna 100a, from the perspective of improved radiation efficiency.

Also, the positions of the lines 108a1 and 108a2 are preferably at nodes of the electric field of the resonance frequency $f_{THz}$ terahertz waves standing in the antenna 100a. The lines 108a1 and 108a2 here have a configuration where impedance is sufficiently higher than the absolute value of the negative differential resistance of the RTD 101a at the frequency band near the resonance frequency $f_{THz}$. In other words, the lines 108a1 and 108a2 are connected to the antenna so as to have high impedance as viewed from the RTD at the resonance frequency $f_{THz}$. In this case, the antennas of the semiconductor device 100 (antennas other than the antenna 100a) and the antenna 100a are isolated at the frequency $f_{THz}$ with regard to routes via bias lines including the lines 108a1 and 108a2 and the bias circuit $V_a$. This suppresses current of the resonance frequency $f_{THz}$ induced at each antenna from acting on (affecting) other adjacent antennas via bias lines. This is a configuration that also suppresses interference between the electric field of the resonance frequency $f_{THz}$ standing in the antenna 100a and the power supply members thereof.

The bias circuits $V_a$ and $V_b$ each include the shunt resistor 121, the wiring 122, the power source 123, and the capacitor 124. The wiring 122 invariably has a parasitic inductance component, and accordingly is illustrated as an inductor in FIG. 1C. The power source 123 supplies bias signals necessary for driving the RTD 101a and RTD 101b. The voltage of the bias signals is typically selected from the voltage of the negative differential resistance region of the RTDs used as the RTDs 101a and 101b. In the case of the antenna 100a, the bias voltage from the bias circuits $V_a$ and $V_b$ is supplied to the RTD 101a within the antenna 100a via the lines 108a1 and 108a2.

Now, the shunt resistor 121 and the capacitor 124 of the bias circuits $V_a$ and $V_b$ serve to suppress parasitic oscillation of a relatively-low frequency resonance frequency (typically a frequency band from DC to 10 GHz) due to the bias circuits $V_a$ and $V_b$. A value that is equal to or somewhat lower than the absolute value of the combined negative differential resistance of the RTDs 101a and 101b connected in parallel is selected for the value of the shunt resistor 121. The capacitor 124 is also set so that impedance is equal to or somewhat lower than the absolute value of the combined negative differential resistance of the RTDs 101a and 101b connected in parallel, in the same way as with the shunt resistor 121. That is to say, the bias circuits $V_a$ and $V_b$ are set so that the impedance is lower than the absolute value of the combined negative resistances corresponding to the gain at the DC to 10 GHz frequency band by theses shunt elements. Generally, the capacitor 124 is preferably greater within the above-described range, and capacitance in the order of tens of pF is used in the present embodiment. The capacitor 124 is a decoupling capacitor. A metal-insulator-metal (MIM) structure sharing the substrate with the antenna 100a may be used, for example.

Description Regarding Antenna Array

The semiconductor device 100 has an antenna array where the two antennas 100a and 100b are E-plane coupled. The antennas singularly emit terahertz waves of the frequency $f_{THz}$. The adjacent antennas are mutually coupled by the coupling line 109, and are mutually injection-locked at the resonance frequency $f_{THz}$ of terahertz waves.

Now, being mutually injection-locked means that all of a plurality of self-excitation oscillators are oscillating in a frequency-locked state due to mutual interaction. For example, the antenna 100a and the antenna 100b are mutually coupled by the coupling line 109. Note that "mutually coupled" refers to a phenomenon where a current induced at a certain antenna acts upon another adjacent antenna, and changes the transmission/reception characteristics of each other. Locking of mutually-coupled antennas at the same phase or opposite phase causes the electric field between the antennas to be strengthened or weakened by the mutual injection-locking phenomena, whereby increase/decrease in antenna gain can be adjusted.

Oscillation conditions of the semiconductor device 100 having the antenna array can be determined according to mutual injection locking conditions in a configuration where two or more individual RTD oscillators are coupled, disclosed in "J. Appl. Phys., Vol. 103, 124514 (2008)". Specifically, oscillation conditions for the antenna array where the antenna 100a and the antenna 100b are coupled by the coupling line 109 will be considered. At this time, two oscillation modes of inphase mutual-injection locking and antiphase mutual-injection locking occur. Oscillation conditions for the oscillation mode of inphase mutual-injection locking (even mode) are represented in Expressions (3) and (4), and oscillation conditions for the oscillation mode of antiphase mutual-injection locking (odd mode) are represented in Expressions (5) and (6).

Inphase (even mode): frequency $f=f_{even}$ $$Y_{even}=Y_{aa}+Y_{ab}+Y_{RTD}$$

$$\text{Re}(Y_{even}) \leq 0 \quad (3)$$

$$\text{Im}(Y_{even})=0 \quad (4)$$

Antiphase (odd mode): frequency $f=f_{odd}$ $$Y_{odd}=Y_{aa}+Y_{ab}+Y_{RTD}$$

$$\text{Re}(Y_{odd}) \leq 0 \quad (5)$$

$$\text{Im}(Y_{odd})=0 \quad (6)$$

$Y_{ab}$ is the mutual admittance between the antenna 100a and the antenna 100b here. $Y_{ab}$ is proportionate to a coupling constant representing the strength of coupling between the antennas, and ideally, the real part of $-Y_{ab}$ is large and the imaginary part preferably is zero. The semiconductor device 100 according to the present embodiment is coupled under conditions of inphase mutual-injection locking, where the resonance frequency $f_{THz} \approx f_{even}$. Other antennas are also coupled under conditions of the above-described inphase mutual-injection locking by the coupling line 109 between the antennas, in the same way.

The coupling line 109 is made up of a microstripline that has a structure where the dielectric layer 104 is sandwiched between a third conductor layer 110 stacked on the dielectric layer 104, and the first conductor layer 106. The antennas are coupled by DC coupling in the semiconductor device 100. In order to mutually lock the antennas with each other at the resonance frequency $f_{THz}$, the third conductor layer 110 (the top conductor of the coupling line 109 that couples the antenna 100a and the antenna 100b) is directly connected to the second conductor layer 103a and the second conductor layer 103b. The third conductor layer 110 and the second conductor layers 103a and 103b are formed in the same layer in the semiconductor device 100.

The antenna 100a and the adjacent antenna 100b are mutually coupled by the structure having such a coupling line 109, and operate mutually locked at the oscillated terahertz wave frequency $f_{THz}$. The antenna array locked by DC coupling can lock among adjacent antennas by strong coupling, and accordingly locking operations by frequency locking readily occur, and variance in frequency and phase among the antennas does not readily occur.

The shunt device 130 is disposed (connected) at the center of the coupling line 109 in the semiconductor device 100. The shunt device 130 and the coupling line 109 are connected through a via 114. Specifically, the third conductor layer 110 of the coupling line 109 and a conductor layer 111 that connects to the shunt device 130 are connected through the via 114 formed inside the first dielectric layer 1041. The via 114 is connected to the third conductor layer 110 at a node of the high-frequency electric field of the resonance frequency $f_{THz}$ standing in the coupling line 109. That is to say, it can be said that the shunt device 130 is connected to the coupling line 109 at the node of the high-frequency electric field of the resonance frequency $f_{THz}$ standing in the coupling line 109. The shunt device 130 connected in this way causes frequencies other than the resonance frequency $f_{THz}$ of the terahertz waves to be short-circuited, and the semiconductor device 100 has low impedance at this frequency, whereby occurrence of multimode resonance can be suppressed.

The conductor layer 111 is an electrode stacked on the second dielectric layer 1042 and is connected to resistor layers 1191 and 1192 stacked on the second dielectric layer 1042. The resistor $R_c$ of the shunt device 130 in the equivalent circuit illustrated in FIG. 1A is formed by the resistor layers 1191 and 1192. The resistor layers 1191 and 1192 are connected to conductor layers 1121 and 1122 stacked on the second dielectric layer 1042. The conductor layers 1121 and 1122 are connected to fourth conductor layers 1181 and 1182 stacked on the third dielectric layer 1043 through vias 1071 and 1072. The fourth conductor layers 1181 and 1182 are formed in a layer between the first conductor layer 106 and the second conductor layers 103a and 103b. Capacitor $C_c$ of the shunt device 130 in the equivalent circuit illustrated in FIG. 1A is formed by a MIM capacitor structure where the third dielectric layer 1043, which is part of the dielectric layer 104, is sandwiched between the fourth conductor layers 1181 and 1182 and the first conductor layer 106.

Also, there is demand for miniaturization of the resistor $R_c$, to realize integration of the antenna array. Accordingly, thin films of W—Ti (0.2 μm thick), that have a high relative resistivity and high melting point, with resistivity of 0.7 Ω·μm, are used as the resistor layers 1191 and 1192 in the present embodiment.

The shunt device 130 of the semiconductor device 100 includes two shunt devices. One is a shunt device where a resistor made up of the resistor layer 1191, and capacitor where the third dielectric layer 1043 is sandwiched between the fourth conductor layer 1181 and the first conductor layer 106, are serially connected. The other is a shunt device where a resistor made up of the resistor layer 1192, and capacitor where the third dielectric layer 1043 is sandwiched between the fourth conductor layer 1182 and the first conductor layer 106, are serially connected. Note that the values of the resistor $R_c$ and capacitor $C_c$ can be set to be within the above-described range by appropriately designing the materials, dimensions, and structures of the shunt devices. Now, if the width of the via 114 is excessively great, deterioration in resonance characteristics of the high-frequency electric field of $f_{THz}$ propagated over the coupling line, and deterioration of radiation efficiency due to conductor loss, occur in the same way as with the width of the conductors 117a and 117b. Accordingly, the width of the via 114 preferably is a dimension of a level where there is no interference with the resonance electric field, and typically, not more than λ/10 is suitable.

The three dielectric layers of the first dielectric layer 1041, the second dielectric layer 1042, and the third dielectric layer 1043, are used as the dielectric layer 104 in the semiconductor device 100. The third dielectric layer 1043 is used as the dielectric member for the capacitor $C_c$ of the shunt device 130, and accordingly silicon nitride with a relatively high dielectric constant ($\varepsilon_{r3}$=7) is used for reduction in size of the MIM capacitor structure. Note that $\varepsilon_{r3}$ is the relative dielectric constant of the third dielectric layer 1043. In a case where the dielectric layer 104 has a three-layer configuration as in the present embodiment, the effective relative dielectric constant is determined taking into consideration the thickness and relative dielectric constant of the third dielectric layer 1043 as well.

Description Regarding Comparison with Conventional Semiconductor Device

Figure 3:
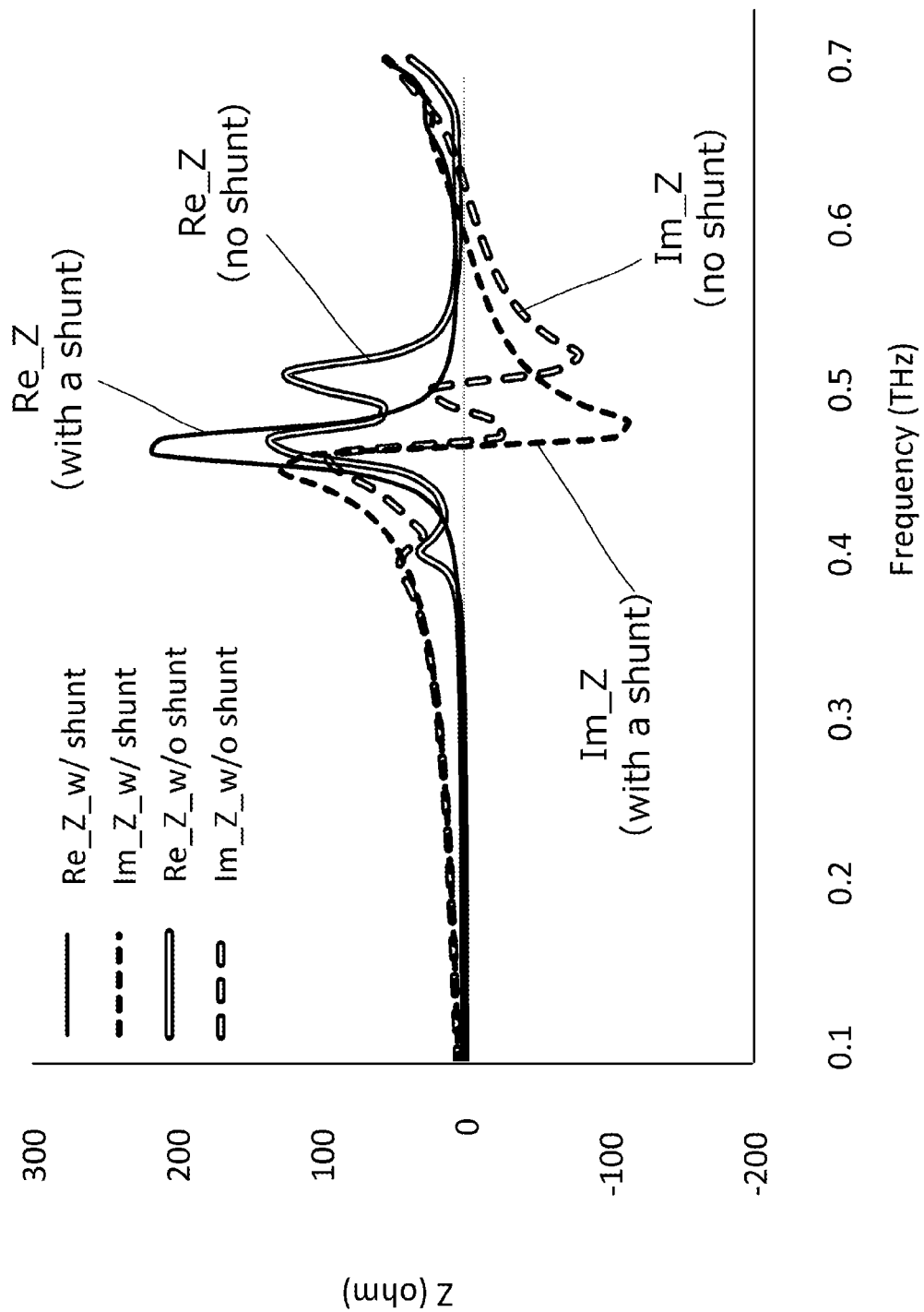
FIG. 3 is a diagram illustrating impedance of the semiconductor device according to the first embodiment.

FIG. 3 illustrates comparison of results of analyzing the impedance of the semiconductor device 100 according to the present embodiment, and the impedance of a conventional semiconductor device that does not have the shunt device 130. Analysis was performed using HFSS, which is a finite element method high-frequency electromagnetic field solver manufactured by ANSYS, Inc. Impedance Z here is equivalent to the inverse of $Y_{aa}$ that is the admittance of the entire structure of the antenna 100a. Also, Z_w/_shunt is impedance Z in a case of having the shunt device 130 as in the present embodiment. Z_w/o_shunt is impedance Z in a case of not having the shunt device 130, as in a conventional arrangement. Re and Im represent the real part and imaginary part, respectively, and resonance occurs at a frequency where the impedance of the imaginary part is 0.

A multipeak occurs in the impedance of the conventional structure, as illustrated in FIG. 3, and there is a possibility that resonance modes are occurring at the two frequency bands of near 0.42 THz and near 0.52 THz. In contrast with this, there is only a single peak at the desired resonance frequency $f_{THz}$=0.48 THz in the impedance of the semiconductor device 100 according to the present embodiment, and multimode is suppressed. The semiconductor device 100 according to the present embodiment has effects of suppressing occurrence of resonance at low frequency bands (not higher than 0.1 THz) outside of the range of the graph illustrated in FIG. 3, due to the shunt device 130.

The shunt device 130 is disposed parallel to the RTD at the coupling line 109 in the semiconductor device 100. This suppresses multimode resonance at frequency bands of relatively high frequency (typically from 10 GHz to 1000 GHz), and enables just resonance of operating frequency $f_{THz}$ of the desired terahertz waves to be selectively stabilized. Also, impedance change due to structure does not readily occur in the semiconductor device 100 according to the present embodiment in comparison with a configuration where the antennas are serially connected by a resistor, and variance in phase and frequency does not readily occur.

Thus, according to the present embodiment, single-mode operation at the terahertz-wave operating frequency $f_{THz}$ can be performed even if the number of antennas in the antenna array is increased. Accordingly, the upper limit of the number of antennas that can be arrayed can be raised, and effects of marked improvement can be anticipated in directionality and frontal intensity in accordance with the increase in the number of antennas in the array. Thus, according to the present embodiment, a semiconductor device that can realize efficient generation or detection of terahertz waves can be provided.

Figure 1B:
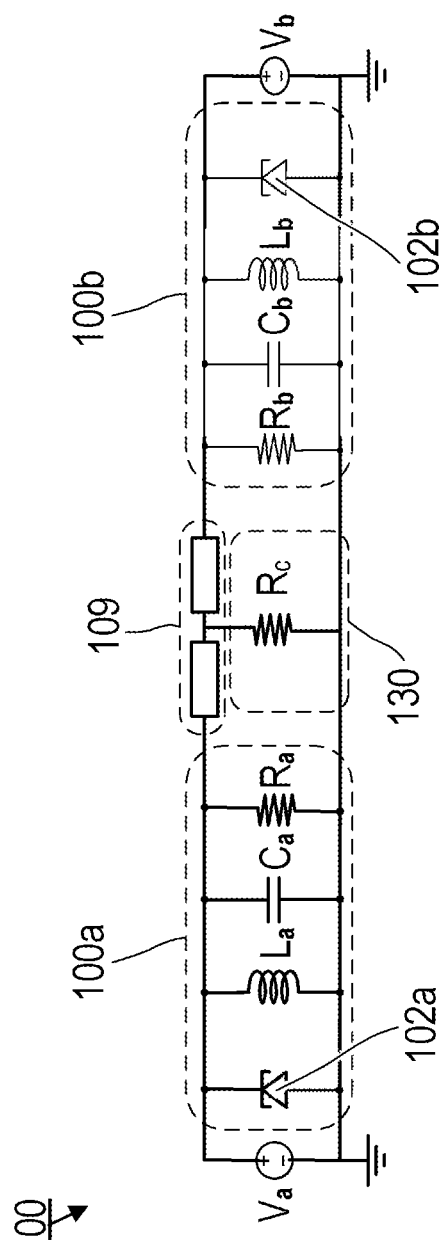

Note that the shunt device is not limited to an arrangement having the resistor $R_c$ and capacitor $C_c$ illustrated in FIG. 1A. For example, the shunt device 130 may be configured from just resistor $R_c$ connected in parallel to the semiconductors 102a and 102b, as illustrated in FIG. 1B.

First Modification

A semiconductor device 200 according to a first modification will be described below. FIGS. 4A through 4C illustrate the semiconductor device 200 according to the first modification. The semiconductor device 200 has an antenna array where two antennas 200a and 200b are H-plane coupled. The semiconductor device 200 has an antenna array of a configuration where the antennas are coupled by AC coupling (capacitive coupling). Detailed description of parts of the configurations and structures of the antennas 200a and 200b that are the same as those of the antennas 100a and 100b in the semiconductor device 100 will be omitted.

A coupling line 209 is made up of a microstripline that has a structure where a dielectric layer 204 and a fourth dielectric layer 2044 are sandwiched between a third conductor layer 210 and a first conductor layer 206, as illustrated in FIG. 4B. The dielectric layer 204 is made up of a first dielectric layer 2041, a second dielectric layer 2042, and a third dielectric layer 2043. Second conductor layers 203a and 203b are formed in a layer between the third conductor layer 210 and the first conductor layer 206. The third conductor layer 210 that is the upper conductor of the coupling line 209 that couples the antennas 200a and 200b overlaps the second conductor layers 203a and 203b by a length x=5 μm near the radiating ends as viewed from the stacking direction (in planar view). At this overlapping portion, the second conductor layers 203a and 203b, the fourth dielectric layer 2044, and the third conductor layer 210 are stacked in that order. Accordingly, a metal-insulator metal (MIM) capacitor structure, where the second conductor layers 203a and 203b and the third conductor layer 210 sandwich the fourth dielectric layer 2044 is formed. Note that between the second conductor layer 203a and the second conductor layer 203b is open regarding DC, and the magnitude of coupling at low-frequency regions lower than the resonance frequency $f_{THz}$ is small, so inter-device isolation is secured. Meanwhile, the magnitude of inter-antenna coupling at the resonance frequency $f_{THz}$ band can be adjusted by capacitance.

In the semiconductor device 200, shunt devices 2301 and 2302 are connected to the coupling line 209. The shunt devices 2301 and 2302 are connected to the coupling line 209 through vias 2141 and 2142. The vias 2141 and 2142 are connected to the third conductor layer 210 at a node of the high-frequency electric field of the resonance frequency $f_{THz}$ standing in the coupling line 209. This enables frequencies other than the resonance frequency $f_{THz}$ of the terahertz waves to be short-circuited, and accordingly occurrence of multimode resonance can be suppressed.

The third conductor layer 210 of the coupling line 209 is connected to resistor layers 2191 and 2192 stacked on the first dielectric layer 2041 through the vias 2141 and 2142 formed inside the fourth dielectric layer 2044. Also, the resistor layers 2191 and 2192 are connected to fourth conductor layers 2181 and 2182 stacked on the third dielectric layer 2043 through vias 2071 and 2072 formed inside the first dielectric layer 2041.

An MIM capacitor structure where the third dielectric layer 2043 is sandwiched between the fourth conductor layers 2181 and 2182 and the first conductor layer 206 is formed. Such an AC coupling structure can weaken coupling among antennas, thereby suppressing transmission loss among antennas, and improved radiation efficiency of the antenna array is anticipated. Note that the width of the vias 2071 and 2072 may be formed large in some instances, since the vias 2071 and 2072 are formed inside the first dielectric layer 2041 that is relatively thick. However, in a configuration where the vias 2071 and 2072 are disposed at a position away from the coupling line 209 as in the present modification, interference of the antenna with the resonance electric field is suppressed even if the width of the vias 2071 and 2072 is large (typically not smaller than λ/10). Accordingly, improved antenna gain can be anticipated.

Second Modification

Figure 5B:
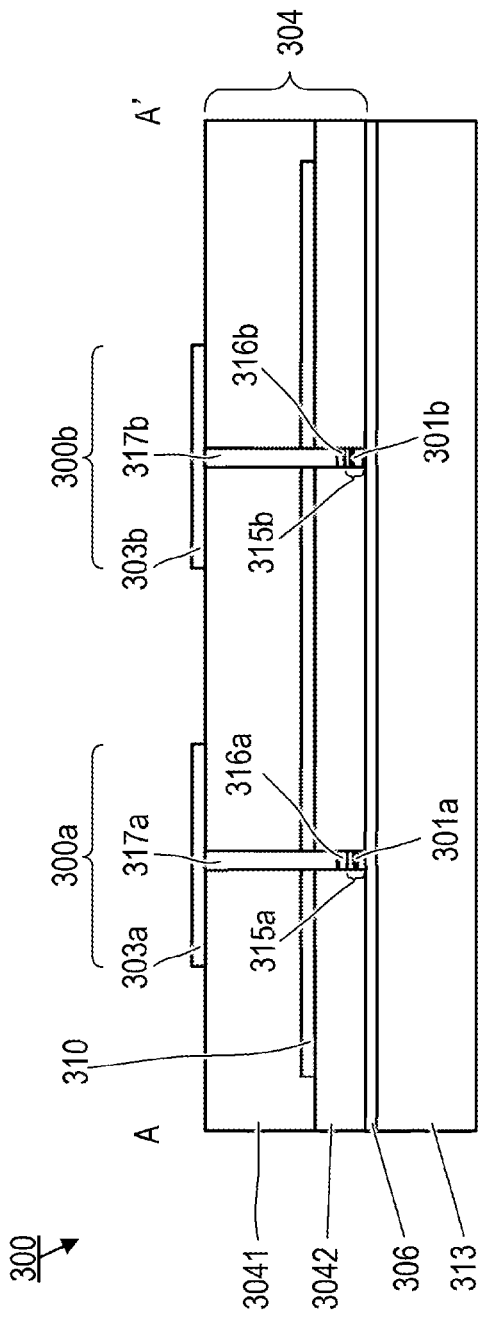
Figure 5C:
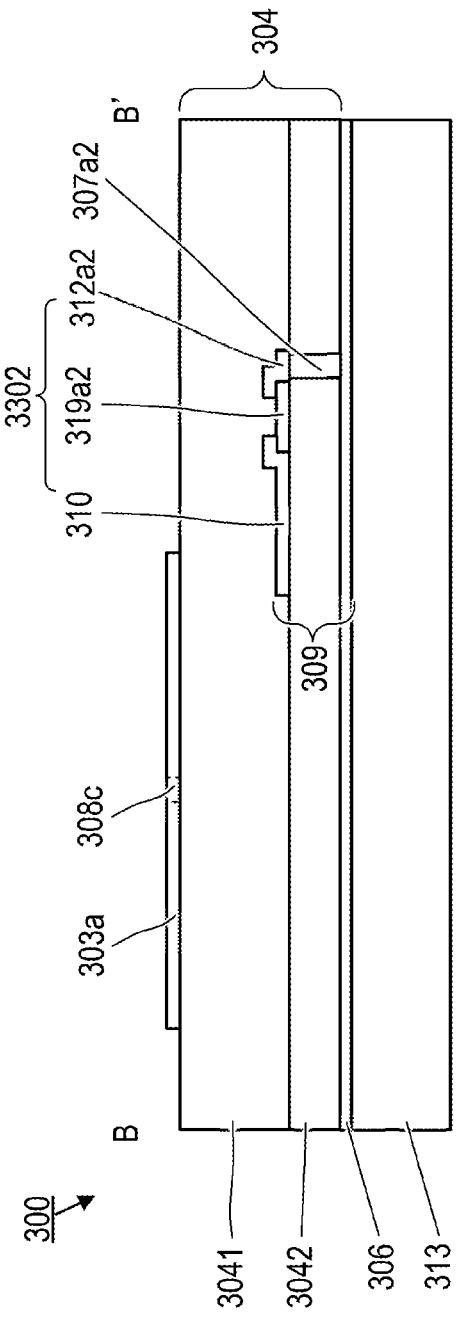

A semiconductor device 300 according to a second modification, which is a specific example of a configuration where the shunt device illustrated in FIG. 1B is made up of a resistor alone will be described below. FIGS. 5A through 5C illustrate the semiconductor device 300 according to the second modification. The semiconductor device 300 has an antenna array where adjacent antennas are connected by a coupling line 309 (microstripline) disposed between a first conductor layer 306 (grounding conductor) and second conductor layers 303a and 303b (patch conductors). Detailed description of the configurations and structures of antennas 300a and 300b that are the same as those of the antennas 100a and 100b in the semiconductor device 100 will be omitted.

The coupling line 309 is a microstripline having a structure where a second dielectric layer 3042 is sandwiched between a third conductor layer 310 (upper conductor) and the first conductor layer 306 (grounding conductor), and also serves as a resonator. The antenna 300a has a structure where an RTD 301a has been integrated in a complex resonator made up of a patch antenna (an antenna made up of the first conductor layer 306 and the second conductor layer 303a) and half (the antenna 300a side half) of the coupling line 309. In the coupling line 309, the direction perpendicular to the resonance direction of the antenna (i.e., the A-A' direction) is the longitudinal direction.

The length of the coupling line 309 and the size of the patch antennas are important parameters that determine the frequency of electromagnetic waves that each of the antennas 300a and 300b emit. Specifically, the resonance frequency $f_{THz}$ of the antenna 300a can be determined from the length of the second conductor layer 303a and the length of the third conductor layer 310 in the A-A' direction. For example, an arrangement where half of the length of the third conductor layer 310 in the A-A' direction is an integer multiple of the effective wavelength of the desired resonance frequency, and the length of the second conductor layer 303a is ½ of the effective wavelength of the desired resonance frequency, is suitable.

The bias circuits $V_a$ and $V_b$ are connected to lines 308a and 308b made up of conductor layers stacked on a first dielectric layer 3041. The third conductor layer 310 is connected to a via 317a. The via 317a connects between the second conductor layer 303a and the RTD 301a.

Adjacent antennas are coupled by DC coupling by the coupling line 309. For example, the antennas 300a and 300b are directly coupled by the third conductor layer 310 that is the upper conductor of the coupling line 309. In order to intensify frequency locking between the antennas, the RTDs 301a and 301b are preferably disposed at the maximum point of the electric field of electromagnetic waves (resonance frequency $f_{THz}$) standing in the coupling line.

Four shunt devices 3301 through 3304 are disposed in the coupling line 309 in the semiconductor device 300, as a specific configuration example of the equivalent circuit of resistor $R_c$ alone, illustrated in FIG. 1B. For example, in the cross-section of the shunt device 3302 illustrated in FIG. 5C, the third conductor layer 310 making up the coupling line 309 is connected to a conductor layer 312a2 stacked on the second dielectric layer 3042, via a resistor 319a2. The conductor layer 312a2 is also connected to the first conductor layer 306 that is a grounding conductor, through a via 307a2 formed inside the second dielectric layer 3042. The present modification is a simple structure where there is no need for integration of capacitor structures, and accordingly the number of manufacturing steps can be reduced.

First Example

As a first example, a specific configuration of the semiconductor device 100 according to the first embodiment will be described with reference to FIGS. 2A through 2C. The semiconductor device 100 is a semiconductor device that is capable of single-mode oscillation at the 0.45 to 0.50 THz frequency band.

The RTDs 101*a* and 101*b* are configured with a Multiple Quantum Well structure of InGaAs/AlAs lattice-matched on the substrate 113 formed of InP. RTDs of a double-barrier structure are used in the present example. The semiconductor heterostructure of the RTDs is the structure disclosed in "J Infrared Milli Terahz Waves (2014) 35:425-431". As for measurement values of current-voltage characteristics of the RTDs 101*a* and 101*b*, the peak current density is 9 mA/m$^2$, and negative differential conductance per unit area is 10 mS/μm$^2$.

A mesa structure made up of the semiconductor layer 115*a* including the RTD 101*a*, and the electrode 116*a* that is an Ohmic electrode, is formed in the antenna 100*a*. In the present example, a columnar mesa structure that is 2 μm in diameter is formed. The magnitude of the negative differential resistance of the RTD 101*a* is approximately −30Ω per diode here. In this case, the negative differential conductance ($G_{RTD}$) of the semiconductor layer 115*a* including the RTD 101*a* is estimated to be approximately 30 mS, and the diode capacitance ($C_{RTD}$) of the RTD 101*a* is estimated to be approximately 10 fF.

The antenna 100*a* is a patch antenna of a structure where the dielectric layer 104 is sandwiched by the second conductor layer 103*a* (patch conductor) and the first conductor layer 106 (grounding conductor). The semiconductor layer 115*a* that includes the RTD 101*a* inside is integrated in the antenna 100*a*. The antenna 100*a* is a square patch antenna where one side of the second conductor layer 103*a* is 150 μm, and the resonator length L of the antenna is 150 μm. A metal layer primarily of an Au thin film, of which resistivity is low, is used for the second conductor layer 103*a* and the first conductor layer 106.

The dielectric layer 104 is disposed between the second conductor layer 103*a* and the first conductor layer 106. The dielectric layer 104 is made up of the three layers of the first dielectric layer 1041, the second dielectric layer 1042, and the third dielectric layer 1043. The first dielectric layer 1041 is formed of benzocyclobutene (BCB, manufactured by The Dow Chemical Company, $\varepsilon_{r1}$=2), 5 μm thick. The second dielectric layer 1042 is formed of SiO$_2$ (plasma CVD, $\varepsilon_{r2}$=4), 2 μm thick. The third dielectric layer 1043 is formed of SiN$_x$ (plasma CVD, $\varepsilon_{r3}$=7), 0.1 μm thick. That is to say, the three dielectric layers that the dielectric layer 104 includes are each formed (configured) of different materials in the present example.

The first conductor layer 106 is formed of a Ti/Pd/Au layer (20/20/200 nm), and a semiconductor having an n+-InGaAs layer (100 nm) where electron density is not less than 1×10$^{18}$ cm$^{-3}$. In the first conductor layer 106, the metal and semiconductor are connected by low-resistance Ohmic contact.

The electrode 116*a* is an Ohmic electrode formed of a Ti/Pd/Au layer (20/20/200 nm). The electrode 116*a* is connected by low-resistance Ohmic contact to the semiconductor made of the n+-InGaAs layer (100 nm) where electron density is not less than 1×10$^{18}$ cm$^{-3}$, formed on the semiconductor layer 115*a*.

The structure of around the RTD 101*a* in the stacking direction is, in order from the substrate 113 side, the substrate 113, the first conductor layer 106, the semiconductor layer 115*a* including the RTD 101*a*, the electrode 116*a*, the conductor 117*a*, and the second conductor layer 103*a*, stacked in that order and electrically connected to each other. The conductor 117*a* is formed (configured) of a conductor containing Cu (copper).

The RTD 101*a* is disposed at a position shifted by 40% (60 μm) in the resonance direction (i.e., A-A' direction) from the center of gravity of the second conductor layer 103*a*. The input impedance at the time of supplying high-frequency power from the RTD to the patch antenna is determined by the position of the RTD 101*a* in the antenna 100*a*. The second conductor layer 103*a* is connected to the lines 108*a*1 and 108*a*2.

The lines 108*a*1 and 108*a*2 are formed of metal layers including Ti/Au (5/300 nm) stacked on the first dielectric layer 1041, and are connected to the bias circuits $V_a$, $V_b$. The antenna 100*a* is designed so that oscillation of power of 0.2 mW is obtained at the frequency $f_{THz}$=0.48 THz, by setting the bias to the negative resistance region of the RTD 101*a*. The lines 108*a*1 and 108*a*2 are configured of patterns of metal layers including Ti/Au (5/300 nm), 75 μm in length in the resonance direction (i.e., A-A' direction) and 10 μm in width. The lines 108*a*1 and 108*a*2 are connected to the second conductor layer 103*a* at the center of the second conductor layer 103*a* in the resonance direction (i.e., A-A' direction) and at the end in the B-B' direction. The connection position corresponds to a node of the electric field of $f_{THz}$ terahertz waves standing in the antenna 100*a*.

The semiconductor device 100 has an antenna array where the two antennas 100*a* and 100*b* are arrayed in the electric field direction of radiated electromagnetic waves (i.e., E-plane direction) and mutually coupled. The antennas are designed to singularly emit terahertz waves of the frequency $f_{THz}$, and are laid out in the A-A' direction at a pitch of 340 μm. The adjacent antennas are mutually coupled by the coupling line 109 including the third conductor layer 110 configured of Ti/Au (5/300 nm). More specifically, the second conductor layer 103*a* and the second conductor layer 103*b* are connected by the third conductor layer 110 that is 5 μm in width and 190 μm in length. The antenna 100*a* and the antenna 100*b* are mutually injection-locked and oscillate at the resonance frequency $f_{THz}$=0.48 THz, in a state with the phases matching each other (inphase).

In the semiconductor device 100, the shunt device 130 is disposed at the center of the coupling line 109. The shunt device 130 and the coupling line 109 are connected through the via 114. Specifically, the third conductor layer 110 of the coupling line 109, and the conductor layer 111, configured of Ti/Au (5/300 nm), are connected through the via 114 formed of Cu inside the first dielectric layer 1041.

The via 114 is a columnar structure 10 μm in diameter and 5 μm in height. The conductor layer 111 is connected to the resistor layers 1191 and 1192 formed of W—Ti (0.2 μm thick) with resistivity of 0.7 Ω·μm. The resistor layers 1191 and 1192 here are designed to be 20Ω each, and worked to patterns 4 μm in width and 20 μm in length.

The resistor layers 1191 and 1192 are connected to the fourth conductor layers 1181 and 1182 through the conductor layers 1121 and 1122 and the vias 1071 and 1072. The conductor layers 1121 and 1122 and the fourth conductor layers 1181 and 1182 are formed (configured) of Ti/Au (5/300 nm). The vias 1071 and 1072 are formed of Cu. The vias 1071 and 1072 are columnar structures 10 μm in diameter, and 2 μm in height.

The shunt device 130 where the resistor $R_c$ and capacitor $C_c$ are serially connected is formed by the MIM capacitor structure where the third dielectric layer 1043 is sandwiched between the fourth conductor layers 1181 and 1182 and the first conductor layer 106, and the resistor layers 1191 and 1192.

The third dielectric layer 1043 is formed (configured) of silicon nitride ($\varepsilon_{r3}$=7), 0.1 μm thick. The fourth conductor layers 1181 and 1182 are formed as rectangular patterns 50 μm in width and 60 μm in length. Capacitance of 2 pF is formed for each MIM structure. Connecting the shunt device 130 to the coupling line 109 as in the semiconductor device 100 suppresses multimode resonance at frequency bands of relatively high frequency, and enables just the operating frequency $f_{THz}$ of the desired terahertz waves to be selected in a stable manner. Note that the frequency band of the relatively high frequency typically is 10 GHz to 1000 GHz.

Supply of electric power to the semiconductor device 100 is performed from the bias circuits $V_a$ and $V_b$, and bias voltage of negative differential resistance region is normally applied to supply bias current. In the case of the semiconductor device 100 disclosed in the present example, radiation of 0.4 mW terahertz electromagnetic waves is obtained at the frequency of 0.48 THz by oscillation operations in the negative resistance region.

In this way, according to the present example, loss of electromagnetic waves can be reduced as compared with conventional arrangements, and more efficient emission or detection of terahertz waves can be realized.

Manufacturing Method for Semiconductor Device

Next, a manufacturing method for the semiconductor device 100 according to the present example will be described. The semiconductor device 100 is manufactured (fabricated) as follows.

(1) An InGaAs/AlAs semiconductor multilayer structure is epitaxially grown on the InP substrate 113, thereby forming the semiconductor layers 115a and 115b including the RTDs 101a and 101b. Molecular-beam epitaxy (MBE) or metalorganic vapor-phase epitaxy (MOVPE) is used for the epitaxial growth.

(2) Film formation of a Ti/Pd/Au layer (20/20/200 nm) is performed on the semiconductor layers 115a and 115b by sputtering, thereby forming the electrodes 116a and 116b.

(3) The electrodes 116a and 116b and the semiconductor layers 115a and 115b are formed into circular mesa forms 2 μm in diameter, thereby forming mesa structures. The mesa forms are formed using photolithography and dry etching by inductively-coupled plasma (ICP).

(4) After the first conductor layer 106 is formed on the substrate 113 by the lift-off process being performed on the etched face, a film of silicon nitride, 0.1 μm thick, is formed by plasma CVD, thereby forming the third dielectric layer 1043.

(5) A Ti/Au layer (5/300 nm) making up the fourth conductor layers 1181 and 1182 is formed on the third dielectric layer 1043. Thus, capacitor $C_c$ where the third dielectric layer 1043 is sandwiched between the fourth conductor layers 1181 and 1182 and the first conductor layer 106 is formed.

(6) A film of silicon oxide, 2 μm thick, is formed by plasma CVD, thereby forming the second dielectric layer 1042.

(7) The second dielectric layer 1042 is dry-etched and via holes are formed. Once the via holes are formed, the via holes are filled in with Cu and planarized, using sputtering, electroplating, and chemical-mechanical polishing, thereby forming the vias 1071 and 1072.

(8) The resistor layers 1191 and 1192 of W—Ti (0.2 μm thick) on the second dielectric layer 1042 are formed by sputtering and dry etching. Thus, the shunt device 130 where the capacitor $C_c$ and resistor $R_c$ are serially connected is formed.

(9) The conductor layers 111, 1121, and 1122, of a Ti/Au layer (5/300 nm) on the second dielectric layer 1042, are formed by sputtering and dry etching.

(10) Filling in with BCB and planarization are performed using spin coating and dry etching, thereby forming the first dielectric layer 1041, 5 μm thick.

(11) The BCB and silicon oxide of the portions making up the conductors 117a and 117b and the via 114 are removed by photolithography and dry etching, forming via holes.

(12) The via holes are filled in with a conductor containing Cu, thereby forming the conductors 117a and 117b and the via 114. Formation of the conductors 117a and 117b and the via 114 is performed using sputtering, electroplating, and chemical-mechanical polishing, thereby filling the via holes with Cu and planarizing.

(13) A film for an electrode Ti/Au layer (5/300 nm) is formed by sputtering, thereby forming the second conductor layers 103a and 103b and the third conductor layer 110.

(14) Photolithography and dry etching are performed by inductively-coupled plasma (ICP), thereby patterning the second conductor layers 103a and 103b and the third conductor layer 110. This forms the coupling line 109.

(15) The shunt resistor 121 and MIM capacitor 124 are formed inside the chip, and the shunt resistor 121 and MIM capacitor 124 are connected to the wiring 122 and the power source 123 by wire bonding or the like. Thus, the semiconductor device 100 is completed.

A preferred embodiment and example of the present invention has been described above, but the present invention is not limited to the embodiment and example, and various modifications and alterations may be made without departing from the spirit and scope thereof. For example, a case where the carriers are electrons is assumed in the description of the embodiment and example made above, but this is not limiting, and an arrangement may be made where holes are used. Materials for the substrate and dielectric members can be selected in accordance with usage, and semiconductors such as silicon, gallium arsenide, indium arsenide, gallium phosphide, and so forth, glass, ceramics, and resins such as polytetrafluoroethylene, polyethylene terephthalate, and so forth, can be used. Note that the structures and materials in the embodiment and example described above can be selected as appropriate in accordance with the desired frequency and so forth.

Further, in the above-described embodiment and example, a square patch antenna is used as the terahertz-wave resonator. However, the shape of the resonator is not limited to this, and a resonator of a structure using a patch conductor that is polygonal such as rectangular or triangular or the like, circular, elliptical, and so forth, for example, can be used.

The number of negative differential resistance devices to be integrated in the semiconductor device is not limited to one, and a resonator may be made that has a plurality of negative differential resistance devices. The number of lines is not limited to one, and a configuration may be made where a plurality of lines are provided.

Also, a double-barrier RTD made of InGaAs/AlAs grown on an InP substrate has been described above for the RTD. However, these structures and materials are not limiting, and combinations of other structures and materials may be made. For example, an RTD having a triple-barrier quantum well structure, or an RTD having a multiple-barrier quantum well structure of fourfold or more, may be used.

Also, each of the following combinations may be used as RTD materials.

GaAs/AlGaAs and GaAs/AlAs, InGaAs/GaAs/AlAs formed on a GaAs substrate

InGaAs/InAlAs, InGaAs/AlAs, InGaAs/AlGaAsSb formed on an InP substrate

InAs/AlAsSb and InAs/AlSb formed on an InAs substrate

SiGe/SiGe formed on a Si substrate

According to the present technology, more efficient generation or detection of terahertz waves can be realized in a device provided with a plurality of antennas.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-173084, filed on Sep. 24, 2019, which is hereby incorporated by reference herein in its entirety.

What is claimed is:

1. A device comprising:
a first antenna arranged on a substrate, the first antenna comprising a first semiconductor layer having terahertz-wave gain and a first conductor layer;
a second antenna arranged on the substrate, the second antenna comprising a second semiconductor layer having terahertz-wave gain and a second conductor layer;
a third conductor layer arranged on the substrate and electrically connecting the first antenna and the second antenna; and
a shunt device arranged on the substrate and electrically connected to the third conductor layer,
wherein, in planar view, the shunt device does not overlap with at least the first conductor layer.

2. The device according to claim 1, wherein, in planar view, the shunt device does not overlap with the second conductor layer.

3. The device according to claim 1, wherein the shunt device comprises at least a first capacitance.

4. The device according to claim 3, wherein the first capacitance comprises at least a fourth conductor layer.

5. The device according to claim 4, further comprising a fifth conductor layer arranged on the substrate,
wherein the fifth conductor layer is located between the first conductor layer and the substrate and between the fourth conductor layer and the substrate.

6. The device according to claim 5, wherein the fifth conductor layer is supplied with a ground potential.

7. The device according to claim 4, wherein a distance from the substrate to the fourth conductor layer is shorter than a distance from the substrate to the first conductor layer.

8. The device according to claim 3, wherein the shunt device comprises at least a second capacitance, and
wherein, in planar view, the third conductor layer is located between the first capacitance and the second capacitance.

9. The device according to claim 8, wherein shunt device comprises at least a first resistance and a second resistance, and
wherein, in planar view, the first resistance is located between the third conductor layer and the first capacitance, and the second resistance is located between the third conductor layer and the second capacitance.

10. The device according to claim 9, wherein the first resistance and the first capacitance are connected in series, and the second resistance and the second capacitance are connected in series.

11. The device according to claim 1, wherein a length from the substrate to the third conductor layer is equal to a length from the substrate to the first conductor layer.

12. The device according to claim 1, wherein the shunt device is connected to a node of an electric field of the terahertz-wave in the third conductor layer.

13. The device according to claim 1, further comprising a plurality of antennas, wherein the first antenna, the second antenna, and the plurality of antennas are arranged in a m×n matrix, with m≥2 and n≥2.

14. The device according to claim 1, wherein the first conductor layer constitutes a patch antenna.

15. The device according to claim 14, wherein the at least one of the first semiconductor layer and the second semiconductor layer comprises a negative resistance element.

16. The device according to claim 15, wherein the negative resistance element is a resonance tunnel diode.

17. The device according to claim 1, wherein the terahertz-wave is an electromagnetic wave in the frequency region of 30 GHz or more and 30 THz or less.

* * * * *